United States Patent
Jin et al.

(10) Patent No.: US 8,288,233 B2
(45) Date of Patent: Oct. 16, 2012

(54) METHOD TO INTRODUCE UNIAXIAL STRAIN IN MULTIGATE NANOSCALE TRANSISTORS BY SELF ALIGNED SI TO SIGE CONVERSION PROCESSES AND STRUCTURES FORMED THEREBY

(75) Inventors: Been-Yih Jin, Lake Oswego, OR (US); Brian Doyle, Portland, OR (US); Jack Kavalieros, Portland, OR (US); Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 11/864,726

(22) Filed: Sep. 28, 2007

(65) Prior Publication Data
US 2009/0085062 A1   Apr. 2, 2009

(51) Int. Cl.
*H01L 21/8244* (2006.01)
(52) U.S. Cl. ........................ 438/283; 438/157
(58) Field of Classification Search ............. 438/283, 438/157
See application file for complete search history.

(56) References Cited

U.S. PATENT DOCUMENTS

| 6,680,496 | B1 | 1/2004 | Hammond et al. | |
|---|---|---|---|---|
| 7,009,226 | B1 | 3/2006 | Sun | |
| 7,078,742 | B2 | 7/2006 | Lin | |
| 7,115,945 | B2 | 10/2006 | Lee | |
| 2004/0094807 | A1* | 5/2004 | Chau et al. | 257/401 |
| 2006/0151808 | A1* | 7/2006 | Chen et al. | 257/188 |

FOREIGN PATENT DOCUMENTS

WO   2009/042981 A2   4/2009
WO   2009/042981 A3   6/2009

OTHER PUBLICATIONS

International Search Report for PCT Application No. PCT/2008/078041 mailed Apr. 20, 2009, 2 pages.
International Preliminary Report on Patentability received for PCT Patent Application No. PCT/US2008/078041, mailed on Apr. 8, 2010, 6 pages.

* cited by examiner

*Primary Examiner* — Samuel Gebremariam
(74) *Attorney, Agent, or Firm* — Forefront IP Lawgroup, PLLC (57) ABSTRACT

Methods of forming a microelectronic structure are described. Embodiments of those methods may include providing a gate electrode comprising a top surface and first and second laterally opposite sidewalls, wherein a hard mask is disposed on the top surface, a source drain region disposed on opposite sides of the gate electrode, and a spacer disposed on the first and second laterally opposed sidewalls of the gate electrode, forming a silicon germanium layer on exposed portions of the top surface and the first and second laterally opposite sidewalls of the source drain region and then oxidizing a portion of the silicon germanium layer, wherein a germanium portion of the silicon germanium layer is forced down into the source drain region to convert a silicon portion of the source drain region into a silicon germanium portion of the source drain region.

6 Claims, 8 Drawing Sheets

METHOD TO INTRODUCE UNIAXIAL STRAIN IN MULTIGATE NANOSCALE TRANSISTORS BY SELF ALIGNED SI TO SIGE CONVERSION PROCESSES AND STRUCTURES FORMED THEREBY

BACKGROUND OF THE INVENTION

Increased performance of microelectronic devices is usually a major factor considered during design, manufacture, and operation of those devices. In some cases, a compressive stress may be employed in a channel region of a planar PMOS transistor of such a device in order to enhance carrier mobility, for example. Commonly used processes to introduce the compressive stress may include performing a source/drain recess etch followed by an epitaxial regrowth in the source/drain area.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a transistor structure of a microelectronic device, are described. Those methods may comprise providing a gate electrode comprising a top surface and first and second laterally opposite sidewalls, a source drain region disposed on opposite sides of the gate electrode, and a spacer disposed on the first and second laterally opposed sidewalls of the gate electrode, forming a silicon germanium layer on exposed portions of the source drain region and then oxidizing a portion of the silicon germanium layer.

A germanium portion of the silicon germanium layer may be pushed and/or forced down into the source drain region to convert a silicon portion of the source drain region into a silicon germanium portion of the source drain region. Methods of the present invention enable direct conversion of a portion of the silicon source/drain into silicon germanium (without the use of a recess etch), which may then exert a net compressive stress into a silicon channel region of the transistor structure to enhance carrier mobility.

Figure 1A:
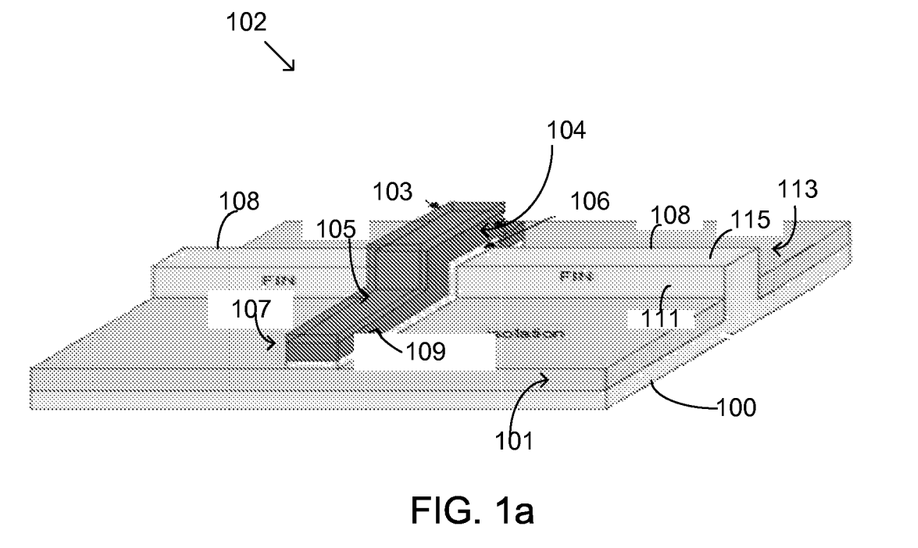
FIGS. 1a-1e represent methods of forming structures according to embodiments of the present invention.

FIGS. 1a-1f illustrate an embodiment of a method of forming a microelectronic structure, such as a trigate transistor structure, for example. FIG. 1a illustrates a gate structure 102 disposed on a substrate 100. The gate structure 102 may comprise a gate electrode 104. The gate electrode 104 may comprise any material suitable to fabricate a gate electrode, such as but not limited to polysilicon and metallic materials and combinations thereof. In one embodiment, the gate electrode 104 may comprise a p-type metal gate electrode, and may comprise materials, such as but not limited to nickel, ruthenium oxide, molybdenum nitride, tantalum nitride, molybdenum silicide, and tantalum silicide. In one embodiment, the substrate 100 may comprise a silicon substrate 100, but may comprise any suitable material depending upon the particular application. An isolation region 101 may be disposed on the substrate 100. In one embodiment, the isolation region 101 may comprise a dielectric material, such as but not limited to silicon dioxide, for example.

In one embodiment, the gate electrode 104 may comprise a top surface 105. In one embodiment, a hard mask 103, such as a silicon nitride and/or a silicon carbide material for example, may be disposed on the top surface 105. The gate electrode 104 may further comprise a first sidewall 107 and a second sidewall 109, wherein the first and the second sidewalls 107, 109 of the gate electrode 104 may be laterally opposite each other. In one embodiment, the gate structure 102 may further comprise a gate dielectric layer 106 that may be disposed beneath the gate electrode 104. In one embodiment, the gate dielectric layer 106 may be disposed between the gate electrode 104 and the isolation region 101. In some cases the gate dielectric layer 106 may comprise a dielectric material such as silicon dioxide, silicon nitride, high dielectric constant (k>7.5) materials, and combinations thereof.

Figure 1B:
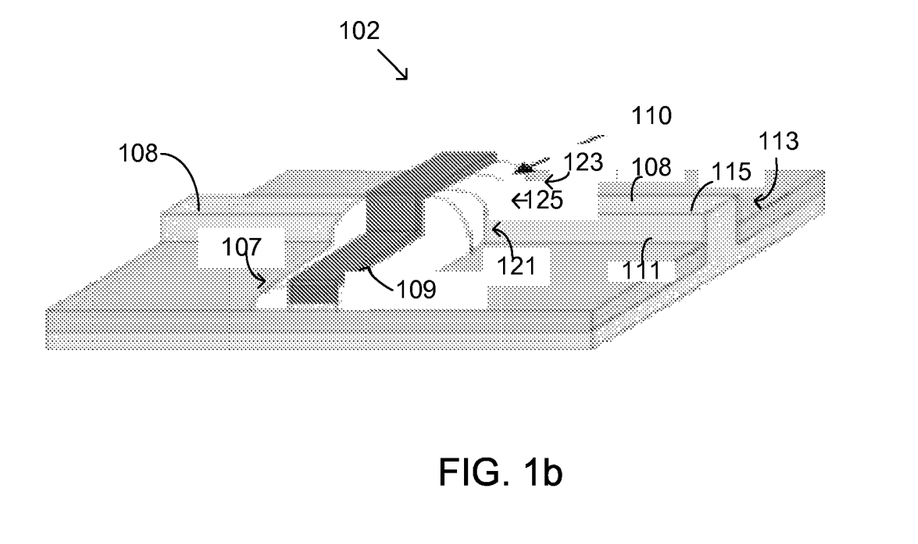

In one embodiment, a source drain region 108 may be disposed on opposite sides of the gate electrode 104. The source drain region 108 may comprise a silicon source drain region in some embodiments. The source drain region 108 may comprise a top surface 115 and laterally opposite first and the second sidewalls 111, 113. In one embodiment, the source drain region 108 may comprise a fin of a trigate transistor. A spacer 110 may be formed on a portion of the gate structure 102, wherein the spacer 110 may be disposed on the first and second laterally opposed sidewalls 107, 109 of the gate electrode 104 (FIG. 1b). The spacer 110 may comprise a dielectric material such as silicon nitride, silicon oxide or combination of them in some cases.

In one embodiment, the gate structure 102 may comprise at least one channel, and in some embodiments, the gate structure 102 may comprise three channels, as in a trigate transistor structure, for example. In one embodiment, the at least one channel may be located underneath the gate dielectric 106 between the source and drain region 108. In one embodiment, a first channel 121 may extend between the source and drain regions 108 on the first sidewall 111 of the gate electrode 104, a second channel 125 may extend between the source and drain regions 108 on the second sidewall 113 of the gate electrode 104, and a top channel 123 may extend between the source and drain regions 108 on the top surface 115 of gate electrode 104.

Figure 1C:
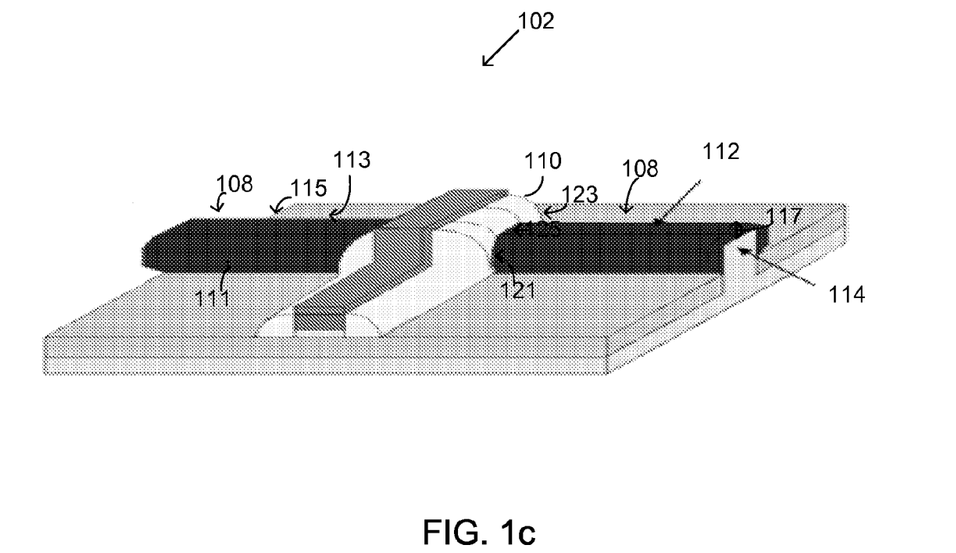

A silicon germanium layer 112 may be selectively formed on exposed portions of the silicon source drain region 108, such as on portions of the top surface 115 and laterally opposite first and the second sidewalls 111, 113 of the source drain region 108 (FIG. 1c). In one embodiment, the silicon germanium layer 112 may be epitaxially grown, using techniques known in the art, and will not generally grow on portions of the source drain region 108 that are covered with a masking material, such as not limited to the spacer 110, which may comprise a dielectric material. In one embodiment, a thickness 117 of the silicon germanium layer 112 may comprise a thickness 117 from about 20 nm to about 60 nm.

Figure 1D:
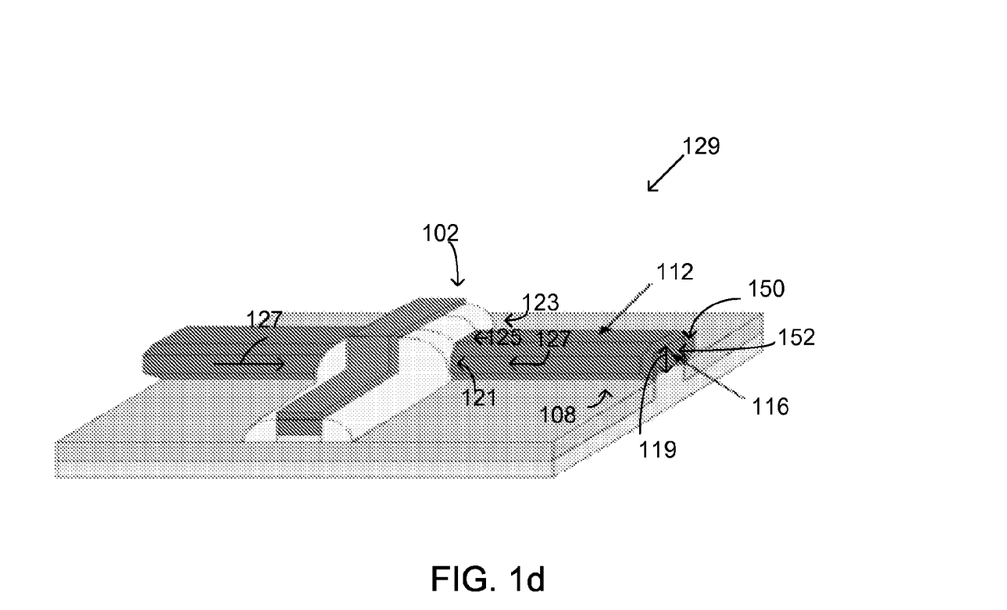

The silicon germanium layer 112 may comprise a percentage of germanium and silicon that may be expressed as the formula $Si_{1-x}Ge_x$. In one embodiment, a portion of the silicon germanium layer 112 may be oxidized (FIG. 1d). In one embodiment, a silicon portion of the silicon germanium layer 112 may be preferentially oxidized, in which a top portion of the silicon germanium layer 112 may be converted to a silicon dioxide layer (not shown). As a result of the oxidation, an amount of the germanium in the silicon germanium layer 112 may be forced and/or pushed down into the source drain region 108 through all 3 sides (115), (111), (113) of source/drain region. When the germanium is forced into the source drain region 108, a portion of the source drain region 108 may be converted into a silicon germanium region of the source drain region 116. In one embodiment, the converted silicon germanium portion of the source drain region 116 may comprise a thickness 119 of about 10 nm to about 60 nm.

In one embodiment, the amount of germanium in the converted silicon germanium portion of the source drain region 116 may be expressed by the formula $Si_{1-y}Ge_y$, wherein the amount and/or percentage of the germanium in the silicon germanium layer 112 may be different than the percentage of germanium in the converted silicon germanium portion of the source drain region 116. In one embodiment, the percentage of germanium in the converted portion of the source drain region 116 may be higher than the percentage of germanium on the silicon germanium layer 112. In one embodiment, an outer most region 150 of the source drain region 106 may comprise a lower germanium percentage that is at least about 10 percent lower than a germanium percentage of an inner region 152 of the source drain region 108.

The oxidized portion of the silicon germanium layer 112 may be removed (not shown) by utilizing an etch process, such as a Hydrofluoric acid wet etch for example, after the portion of silicon in the source drain region 108 has been converted to silicon germanium. In one embodiment, the silicon germanium converted portion of the silicon source drain region 116 may exert a stress 127 into all three channels region under the gate structure 102. In one embodiment, the stress 127 may comprise a uniaxial compressive stress 127. For example, the stress 127 may be exerted into the first, the second and the top channels 121, 125, 123 under the gate structure 102. The stress 127 may increase carrier mobility in the at least one channel, thus improving performance. In one embodiment, the gate structure 102 may comprise a portion of a trigate transistor 129, that may comprise a portion of a stressed trigate transistor.

Figure 1E:
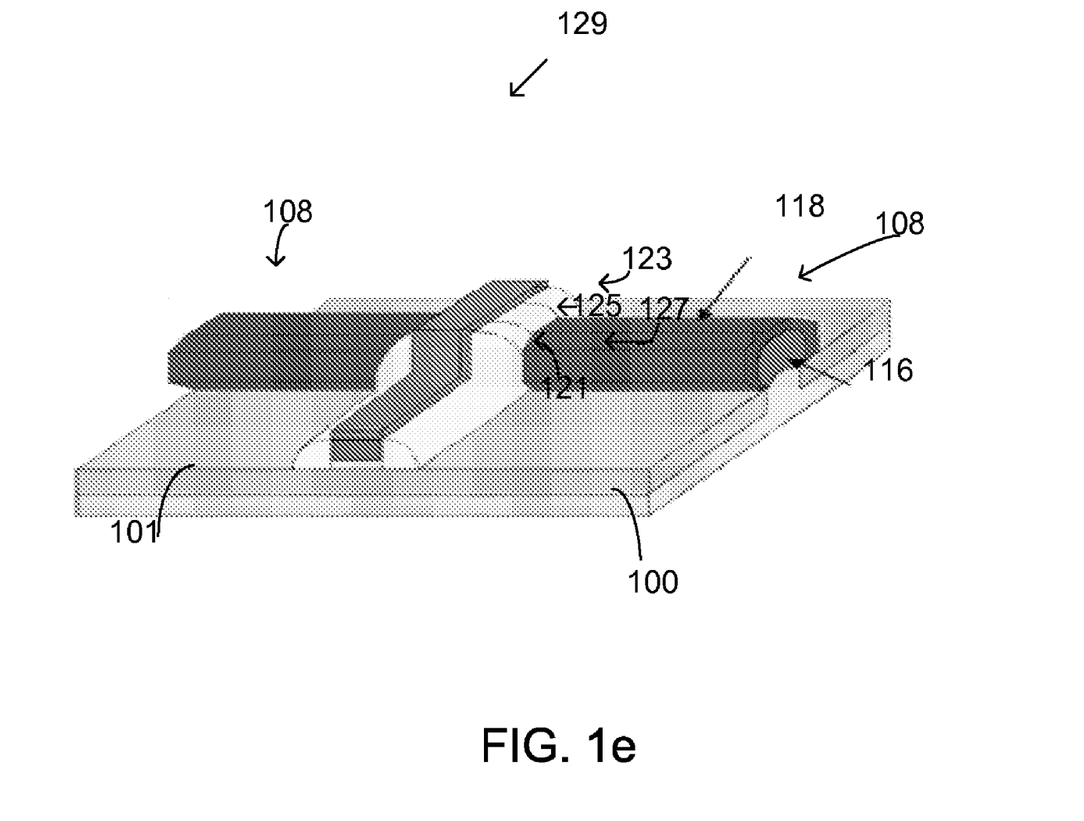

Alternatively, in another embodiment, the trigate transistor 129 may comprise a silicide layer 118 that may be disposed on the silicon germanium converted portion of the silicon source drain region 116 (FIG. 1e). The silicide layer 118 may serve to form the silicon germanium converted portion of the silicon source drain region 116. For example, in a previous process step, an epitaxial silicon germanium layer (not shown) may be grown selectively on exposed portions of the source drain region 108, wherein the silicon germanium layer may comprise a composition expressed as $Si_{1-x}Ge_x$. The silicide layer 118, which may comprise nickel silicide in one embodiment, for example, may be formed on the silicon germanium layer. In one embodiment, the silicide layer 118 may be formed utilizing a rapid thermal annealing process, in which a portion of silicon in the silicon germanium layer 112 may be preferentially consumed during silicide formation.

A portion of the germanium in the silicon germanium layer 112 may be driven into the source drain region 108 as a result of the silicidation layer formation, and the driven germanium may then convert a portion of the silicon of the source drain region 108 to form the silicon germanium converted portion 116 of the source drain region 108. In one embodiment, the silicon germanium converted portion 116 of the source drain region 108 may comprise a composition of $Si_{1-y}Ge_y$. In one embodiment, the composition of the converted portion 116 of the source drain region 108 may comprise a higher percentage of germanium than the silicon germanium layer 112 possesses.

In one embodiment, un-reacted metal (such as Nickel) may be removed from the surface of the isolation region 101 disposed on the substrate 100 subsequent to the conversion of the source drain region 108, by utilizing a suitable etch process. The silicon germanium converted portion of the silicon source drain region 116 may exert a stress 127, such as a uniaxial compressive stress 127 for example, into the first, the second and the top channels 121, 125, 123 of the trigate structure 129. The stress 127 may increase carrier mobility in the at least one channel, thus improving performance.

Figure 1F:
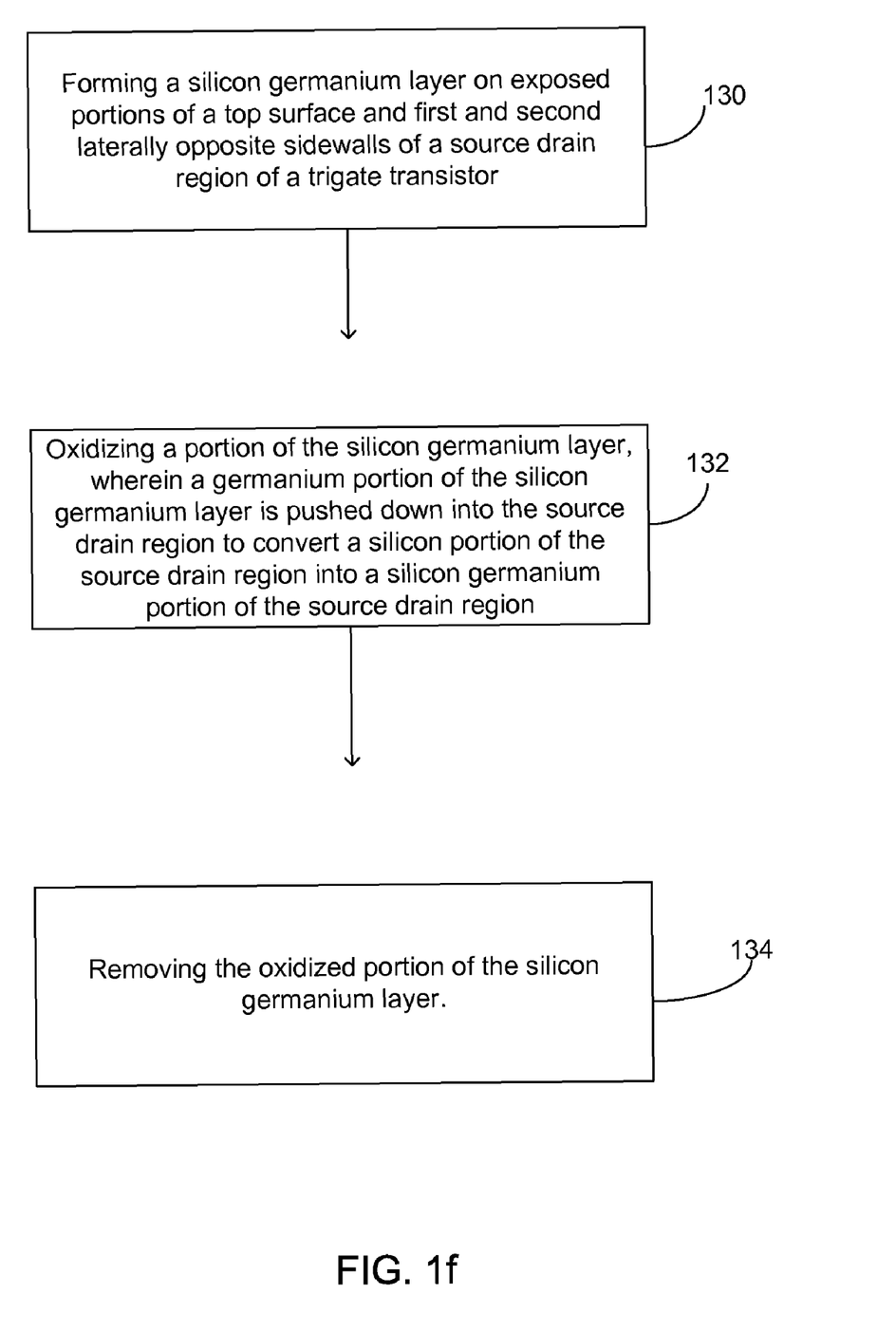
FIGS. 1f-g represent flow charts of methods of forming structures according to embodiments of the present invention.

FIG. 1f depicts a flow chart according to an embodiment of the present application. At step 130, a silicon germanium layer is formed on exposed portions of a top surface and first and second laterally opposite sidewalls of a source drain region of a trigate transistor. At step 132, a portion of the silicon germanium layer is oxidized, wherein a germanium portion of the silicon germanium layer is forced down into the source drain region to convert a silicon portion of the source drain region into a silicon germanium portion of the source drain region. At step 134, the oxidized portion of the silicon germanium layer is removed.

Figure 1G:
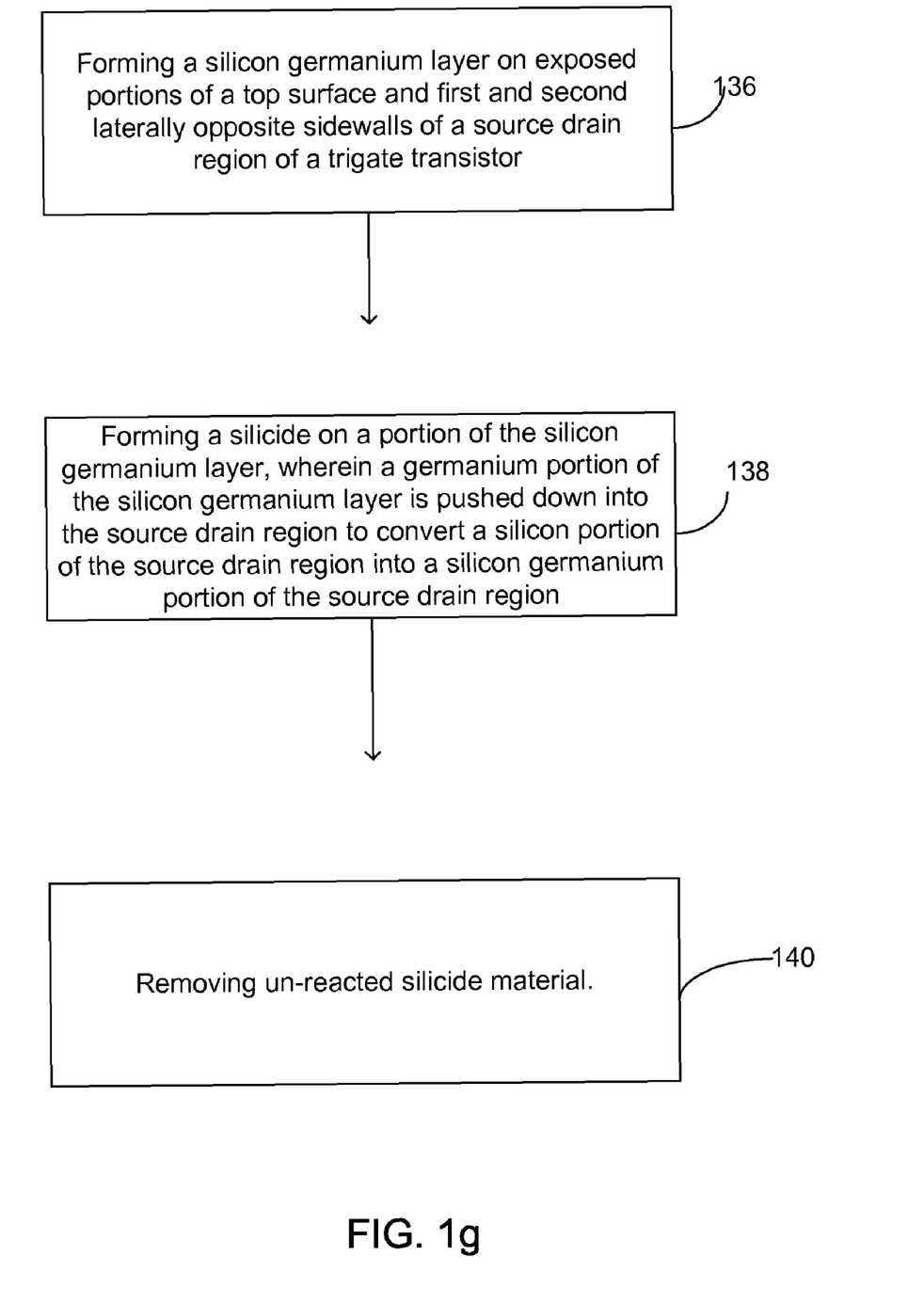

FIG. 1g depicts a flow chart according to another embodiment of the present application. At step 136, a silicon germanium layer is formed on exposed portions of a top surface and first and second laterally opposite sidewalls of a source drain region of a trigate transistor. At step 138, a silicide layer is formed on a portion of the silicon germanium layer, wherein a germanium portion of the silicon germanium layer is forced down into the source drain region to convert a silicon portion of the source drain region into a silicon germanium portion of the source drain region. At step 140, un-reacted metal material is removed.

Figure 2A:
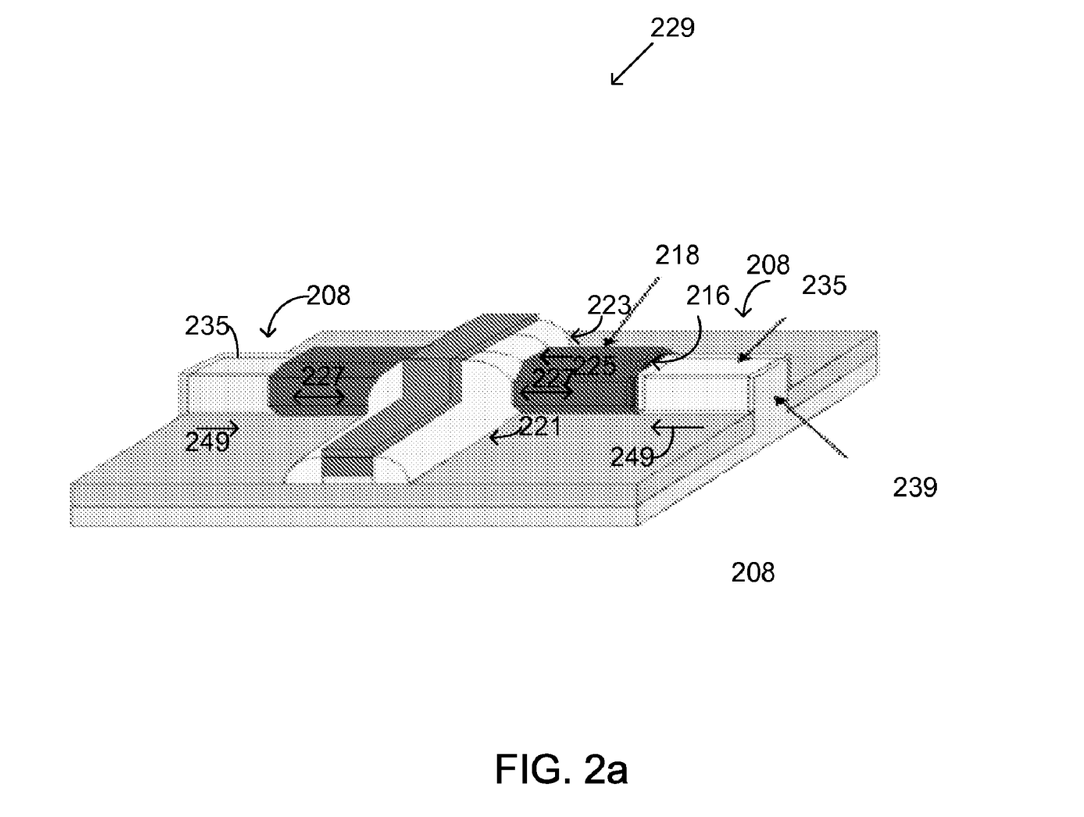
FIG. 2a-2b represent structures according to embodiments of the present invention.

FIG. 2a depicts a portion of a trigate transistor 229 according to an embodiment of the present invention, which may comprise a portion of a stressed trigate transistor in some embodiments. The trigate transistor 229 may comprise all three channels. In one embodiment, the trigate transistor 229 may comprise a first, second and top channel 221, 223, 225 respectively. The trigate transistor 229 may comprise a silicide and/or an oxide region 218 covering a converted silicon germanium source drain region 216. In one embodiment, the silicide and/or oxide region 218 may have formed the converted silicon germanium source drain region 216 (during a previous process step) by forcing down a portion of the germanium disposed within a silicon germanium layer (not shown) into a source drain region 208, in a similar manner as those described previously herein. The silicon germanium converted source drain region 216 may exert a stress 227 on the all three channels 221, 223, 225 of the trigate transistor 229, in a similar manner as described in previous embodiments herein. In one embodiment, the stress 227 may comprise a uniaxial compressive stress.

In one embodiment, the trigate transistor 229 may further comprise a pillar structure 239. The pillar structure 239 may be formed during a previous process step by covering a portion of the source drain region 208 with a masking material 235, such as but not limited to a dielectric material such as Silicon Nitride, for example, such that the pillar structure 239 is not exposed during silicon germanium formation. Thus the pillar structure 239 remains substantially free of silicon germanium material. In one embodiment, the pillar structure 239 may exert a counter stress 249 against the stress 227 exerted into the at least one channels 221, 223, 225. In this manner, the magnitude of the stress 227 exerted into the at least one channel 221, 223, 225 may be tailored to the particular application.

Figure 2B:
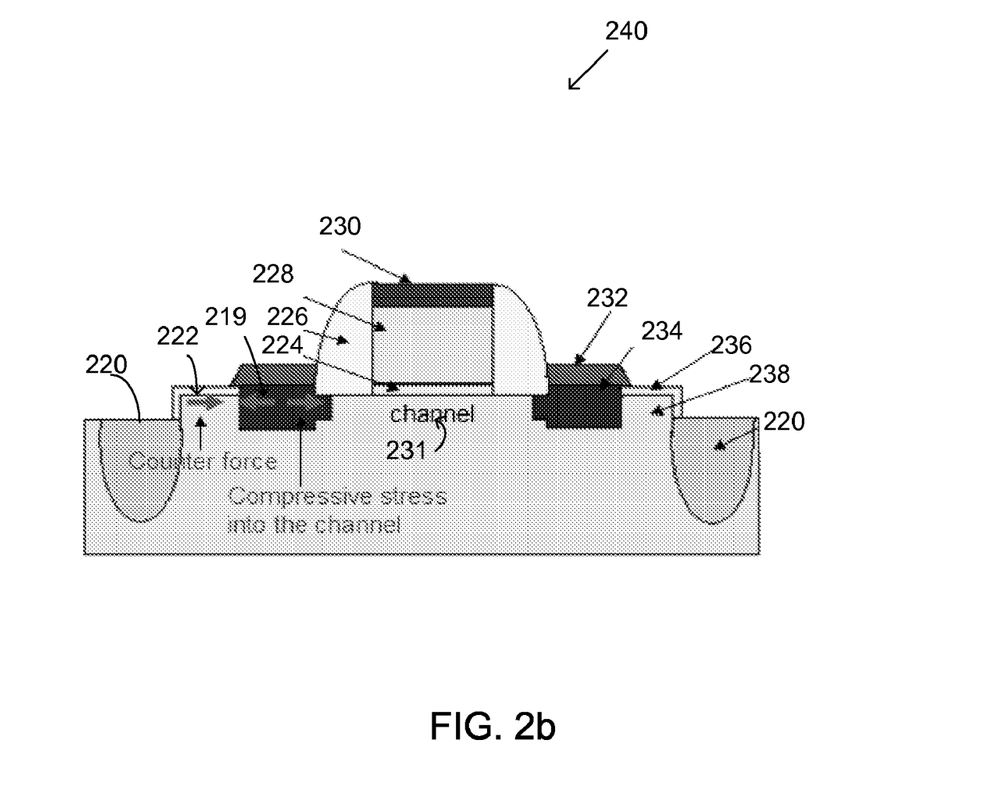

FIG. 2b depicts a cross-sectional view of a planar transistor 240 that may include portions of a stressed planar transistor, according to another embodiment of the present invention. The planar transistor 240 may comprise a gate electrode 228, a spacer 226, a gate dielectric 224, a hard mask 230 and a shallow trench isolation 220. The planar transistor 240 may further comprise a silicide and/or an oxide region 232, a converted silicon germanium source drain region 234, a masking material 236 covering a pillar structure 238, the pillar structure 238 being substantially free of silicon germanium. The converted silicon germanium source drain region 234 may be formed by similar methods as embodiments previously described herein, that is, by an oxidation and/or silicidation process pushing down germanium from a silicon germanium layer into the underlying silicon source drain region, thereby converted a portion of the silicon into silicon germanium.

The converted silicon germanium portion of the source drain region 234 may exert a stress 219 into a channel region 231 of the planar transistor 240. In some embodiment, the stress 219 may be generated from the converted source drain region 234 in a manner similar to that in which the converted source drain region 116 in the trigate structure 129 exerts a stress into all three channels region of FIG. 1d for example. The stress 219, which may comprise a uniaxial compressive stress in some embodiments, may function to increase carrier mobility of devices employing the planar structure of the present embodiment.

In one embodiment, the pillar structure 238 may exert a counter force 222 against the stress 219 exerted by the converted silicon germanium portion of the source drain region 234. In this manner, the magnitude of the stress 219 may be tailored to the particular application.

Conventional processing utilized to introduce strain into planar transistors may not be directly applicable in a non planar multigate transistor structure, due to the free standing nature of the source/drain fin and the facet limiting growth and dislocation defects generated during the faceted epitaxial growth in a narrow recessed trench fin area, for example. Thus, various embodiments of the present invention provide methods and structures to introduce uniaxial strain in multigate transistors by enabling self-aligned silicon to silicon germanium conversion processes in source/drain regions. Such conversion may be applied when processing nanoscale multigate transistors for example. The methods of the present invention may be employed in narrow source/drain regions such as in the case of multigate transistors, where in some cases, recess etching combined with silicon germanium regrowth may be difficult, and wherein epitaxial growth can be self limiting by low growth rate facets, and generating dislocation defects during the faceted epitaxial growth, for example. The methods are also applicable to a planar type transistor.

Figure 3:
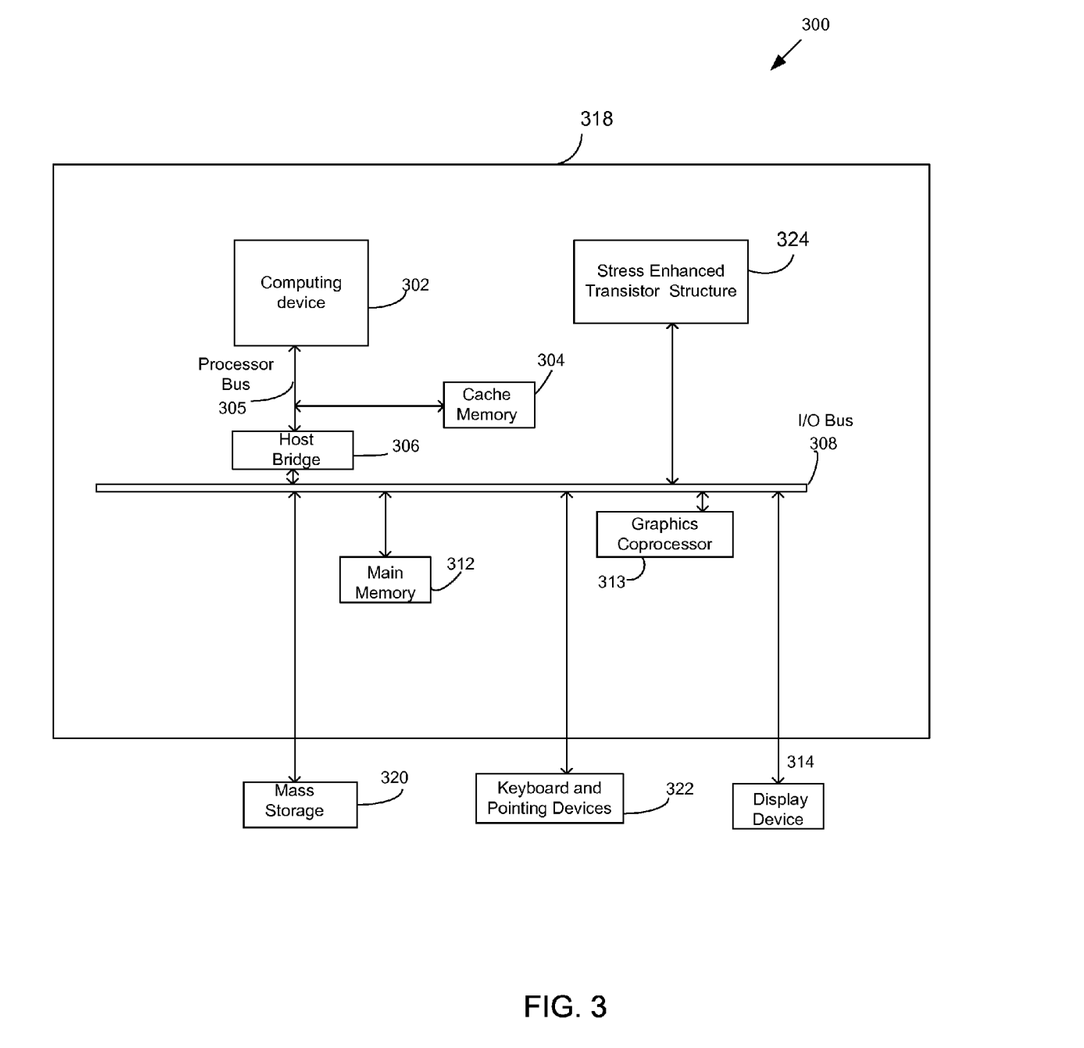
FIG. 3 represents a system according to an embodiment of the present invention.

FIG. 3 is a diagram illustrating an exemplary system 300 that is capable of being operated with methods and structures for fabricating a microelectronic structure, such as the transistor structure 129 of FIG. 1d, for example. It will be understood that the present embodiment is but one of many possible systems in which the stress enhanced transistor structures of the present invention may be used.

In the system 300, the stress enhanced transistor structure 324 may be communicatively coupled to a printed circuit board (PCB) 318 by way of an I/O bus 308. The communicative coupling of the stress enhanced transistor structure 324 may be established by physical means, such as through the use of a package and/or a socket connection to mount the stress enhanced transistor structure 324 to the PCB 318 (for example by the use of a chip package, interposer and/or a land grid array socket). The stress enhanced transistor structure 324 may also be communicatively coupled to the PCB 318 through various wireless means (for example, without the use of a physical connection to the PCB), as are well known in the art.

The system 300 may include a computing device 302, such as a processor, and a cache memory 304 communicatively coupled to each other through a processor bus 305. The processor bus 305 and the I/O bus 308 may be bridged by a host bridge 306. Communicatively coupled to the I/O bus 308 and also to the stress enhanced transistor structure 324 may be a main memory 312. Examples of the main memory 312 may include, but are not limited to, static random access memory (SRAM) and/or dynamic random access memory (DRAM), and/or some other state preserving mediums. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322.

These elements perform their conventional functions well known in the art. In particular, mass storage 320 may be used to provide long-term storage for the executable instructions for a method for forming stress enhanced transistor structures in accordance with embodiments of the present invention, whereas main memory 312 may be used to store on a shorter term basis the executable instructions of a method for forming stress enhanced transistor structures in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as integrated circuits, are well known in the art. Therefore, the Figures provided herein illustrate only portions of an exemplary microelectronic structure that pertains to the practice of the present invention. Thus the present invention is not limited to the structures described herein.

What is claimed is:

1. A method of forming a tri-gate transistor comprising:
    providing a tri-gate electrode comprising a top surface and first and second laterally opposite sidewalls, wherein a hard mask is disposed on the top surface, a source drain region disposed on opposite sides of the tri-gate electrode, and a spacer disposed on the first and second laterally opposed sidewalls of the tri-gate electrode;
    forming a silicon germanium layer on exposed portions of a top surface and first and second laterally opposite sidewalls of the source drain region;
    oxidizing a portion of the silicon germanium layer, wherein a germanium portion of the silicon germanium layer is forced down into the source drain region to convert a silicon portion of the source drain region into a silicon germanium portion of the source drain region; and
    wherein the tri-gate electrode comprises a portion of the tri-gate transistor, and wherein the converted portion of the silicon source drain region exerts a compressive stress into all three channels of the tri-gate transistor.

2. The method of claim 1 wherein exerting the compressive stress comprises wherein the converted silicon germanium portion of the source drain region applies the compressive stress into the channel region.

3. The method of claim 1 wherein the tri-gate electrode comprises at least one of a polysilicon tri-gate electrode and a metal tri-gate electrode.

4. The method of claim 1 further comprising wherein a germanium concentration of the silicon germanium layer is lower than a germanium concentration of the silicon germanium portion of the source drain region.

5. The method of claim 1 further comprising wherein the source drain region comprises a fin of the trigate transistor.

6. A method of forming a tri-gate transistor comprising:
    forming a silicon germanium layer on exposed portions of a top surface and on first and second laterally opposite sidewalls of a source drain region of the tri-gate transistor;
    forming a silicide on the silicon germanium layer, wherein a germanium portion of the silicon germanium layer is forced down into the source drain region to convert a portion of the source drain region into a silicon germanium portion of the source drain region; and
wherein the tri-gate electrode comprises a portion of the tri-gate transistor comprising three channels, and wherein the converted portion of the silicon source drain region exerts a compressive stress into all three channels of the tri-gate transistor.

* * * * *